United States Patent
Ikefuji et al.

(10) Patent No.: US 6,422,473 B1
(45) Date of Patent: Jul. 23, 2002

(54) CIRCUIT CHIP MOUNTED CARD AND CIRCUIT CHIP MODULE

(75) Inventors: Yoshihiro Ikefuji; Shigemi Chimura; Hiroharu Okada, all of Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/331,176

(22) PCT Filed: Dec. 22, 1997

(86) PCT No.: PCT/JP97/04772

§ 371 (c)(1),
(2), (4) Date: Jun. 22, 1999

(87) PCT Pub. No.: WO98/29263

PCT Pub. Date: Jul. 9, 1998

(30) Foreign Application Priority Data

Dec. 27, 1996 (JP) .............................................. 8-351377

(51) Int. Cl.⁷ ............................................. G06K 19/06
(52) U.S. Cl. .......................... 235/492; 235/441; 235/451
(58) Field of Search ................................. 235/492, 375, 235/441, 451; 361/737

(56) References Cited

U.S. PATENT DOCUMENTS

| | | | | |
|---|---|---|---|---|
| 4,857,893 A | * | 8/1989 | Carroll | 340/572 |
| 4,864,292 A | * | 9/1989 | Nieuwkoop | 340/825.31 |
| 4,960,983 A | * | 10/1990 | Inoue | 235/449 |
| 4,996,587 A | * | 2/1991 | Hinrichsmeyer et al. | 357/74 |
| 5,469,399 A | * | 11/1995 | Sato et al. | 365/226 |
| 5,585,668 A | * | 12/1996 | Burns | 257/676 |
| 5,710,458 A | * | 1/1998 | Iwasaki | 257/679 |

FOREIGN PATENT DOCUMENTS

| | | |
|---|---|---|
| EP | 0458306 A2 | 11/1991 |
| EP | 0 737 935 A2 | 10/1996 |
| FR | 2 542 792 * | 9/1984 |
| JP | 60-080232 * | 5/1985 |
| JP | 61-297191 | 12/1986 |
| JP | 3-045399 * | 2/1991 |
| JP | 4-33085 | 2/1992 |
| JP | 4-260990 | 9/1992 |
| JP | 5-250529 | 9/1993 |
| JP | 6-244539 | 9/1994 |
| JP | 7-200766 | 8/1995 |
| WO | WO 96/30944 | 10/1996 |

* cited by examiner

Primary Examiner—Michael G. Lee
Assistant Examiner—Diane I. Lee
(74) Attorney, Agent, or Firm—Arent Fox Kintner Plotkin & Kahn, PLLC

(57) ABSTRACT

Oppositely arranged bumps (82,84) are electrically connected by connecting two IC chips (76,78) through an anisotropic conductor (80) to form an IC chip module (74). With IC chip module (74) having such structure, two IC chips (76,78) provided with functions of a processing portion and an antenna are simply stacked to provide a function for communication, and arrangement of interconnection outside IC chip (76,78) is not necessary. Thus, accidental breakage of the interconnection is avoided and assembly is extremely facilitated. Therefore, a circuit chip mounted card with higher reliability and reduced manufacturing cost and the like can be provided.

4 Claims, 6 Drawing Sheets

CIRCUIT CHIP MOUNTED CARD AND CIRCUIT CHIP MODULE

TECHNICAL FIELD

The present invention relates to circuit chip mounted cards and circuit chip modules, and more particularly to a circuit chip mounted card and a circuit chip module with increased reliability, reduced manufacturing cost and the like.

BACKGROUND ART

Non-contact type IC cards are used for the gate of the ski lift, the gate at the station, automatic sorting of parcels and the like. A conventional non-contact type IC card is exemplified in FIG. 12. An IC card 2 shown in FIG. 12 is an IC card of a single coil type, and includes a coil 4, capacitors C1 and C2 and an IC chip 8.

Capacitors C1 and C2 and IC chip 8 are included in a film substrate formed of synthetic resin. The substrate including capacitors C1 and C2 and IC chip 8 are referred to as a tab (tab: tape automated bonding) 10.

FIG. 13A is a cross sectional view showing IC card 2. A core member 12 of synthetic resin is interposed between surface layer materials 14 and 16. Tab 10 including capacitors C1 and C2 and IC chip 8 is fixed to surface layer material 14 which is exposed to a cavity 18 in core member 12. A connection of tab 10 and IC chip 8 is covered with a sealing material 9 of epoxy resin or the like.

Coil 4 is arranged between surface layer material 14 and core member 12. A wire 20 connects coil 4 and tab 10.

FIG. 13B is a circuit diagram showing IC card 2. IC card 2 receives an electromagnetic wave transmitted from a reader/writer (reading/writing apparatus, not shown) by a resonance circuit 22 formed of coil 4 and capacitor C1 as a power source. It is noted that capacitor C2 is used for smoothing power.

In addition, a control portion (not shown) provided in IC chip 8 decodes information transmitted by the electromagnetic wave for response. The response is performed by changing an impedance of resonance circuit 22. The reader/writer obtains a content of the response by detecting a change in an impedance (impedance reflection) of its own resonance circuit (not shown) due to the change in the impedance of resonance circuit 22 on the side of IC card 2.

Thus, the use of IC card 2 allows data communication in a non-contact state without a power supply source in the card.

However, the above described conventional IC card suffers from the following problem.

In IC card 2, coil 4 and tab 10 must be connected by wire 20. On the other hand, IC card 2 is often put in a wallet or a pocket of a trouser, where it is subjected to considerable bending, twisting and pressing forces. However, a thickness t of IC card 2 shown in FIG. 13A is standard and not so thick. Thus, it is not provided with a significant rigidity against such bending, twisting and pressing forces. Therefore, if IC card 2 is subjected to a significant bending force or the like, a considerable deflection is caused. Such deflection may result in a breakage of wire 20 or disconnection of wire 20 and coil 4 or tab 10. In addition, wire 20 may not be well connected to coil 4 or tab 10.

Further, to ensure a space for coil 4, tab 10 must restrictively be positioned. Thus, in some cases, tab 10 must be provided in a position where a significant deflection is caused. This may result in significant deformation of IC chip 8. Accordingly, IC chip 8 is cracked and does not well function as an IC card.

As described above, the conventional IC card is difficult to handle and lacks in reliability.

Moreover, as coil 4 and tab 10 must be connected by wire 20, complicated assembly is involved, thereby increasing a manufacturing cost.

In addition, provision of capacitors C1 and C2 and the like in tab 10 further increases the manufacturing cost.

DISCLOSURE OF THE INVENTION

An object of the present invention is to provide a circuit chip mounted card with high reliability and low manufacturing cost by overcoming the aforementioned problem related to the conventional card.

According to one aspect, the circuit chip mounted card of the present invention which achieves the above object includes: an antenna for communication utilizing an electromagnetic wave; a processing portion performing a process for communication; a first circuit chip including at least a portion of a processing portion and having a terminal; and a second circuit chip including the antenna and the remaining portion of the processing portion and having a terminal, and is characterized in that the terminals are electrically connected by stacking the first and second circuit chips in a direction of thickness of the card.

According to the present invention, such structure eliminates the need for arranging the interconnection outside the circuit chip because a function of communication is achieved simply by stacking two circuit chips including the functions of the processing portion and antenna. Thus, insufficient connection caused by external arrangement of the interconnection is avoided. Further, even if the deflection is repeatedly caused for the card, breakage of the external arrangement of the interconnection or accidental disconnection would be avoided.

In addition, as the antenna is included in the second circuit chip which is in turn stacked on the first circuit chip, the positional restriction of the circuit chip to ensure a space for the antenna is eliminated. Thus, the stacked circuit chips with a small area when viewed from above is provided in an arbitrary position where a significant deflection would not be caused. As a result, even when a significant force is applied to the card, the circuit chips would not significantly be deformed.

Further, as the interconnection needs not be externally arranged, assembly is extremely facilitated. Thus, reduction in the manufacturing cost is achieved. In addition, as the capacitor is also included in the circuit chip, the work for mounting the capacitor is not necessary. This results in further reduction in the manufacturing cost. Therefore, the circuit chip mounted card with high reliability and low manufacturing cost is achieved.

The circuit chip mounted card according to the present invention having the above described structure is obtained preferably by providing the terminal for the first circuit chip on the side of the second circuit chip, providing the terminal for the second circuit chip on the side of the second circuit chip such that it is opposite to the terminal for the first circuit chip, and directly connecting the first and second circuit chips in a stack.

Such structure allows two circuit chips to be readily connected to form a module using a conventional technique for connecting the terminals. Thus, further reduction in the manufacturing cost is achieved as workability during manufacture increases.

According to another aspect, a circuit chip mounted card of the present invention provided with an antenna for communication utilizing an electromagnetic wave and a processing portion performing a process for communication includes: a first base material; a second base material arranged in a direction of thickness of the card spaced from the first base material with a prescribed distance; a core member layer interposed between the first and second base materials; and a circuit chip module arranged in the core member layer. The circuit chip mounted card is characterized in that it is a composition of a first circuit chip including at least a portion of the processing portion and having a terminal and a second circuit chip including the antenna and the remaining portion of the processing portion and having a terminal arranged opposite to the terminal of the first circuit chip which are stacked and connected in a direction of thickness of the card through an anisotropic conductor to electrically connect the terminals.

According to the present invention, such structure allows two circuit chips to be securely connected with the anisotropic conductor interposed.

In most cases, an opening is provided in the circuit chip for external arrangement of the interconnection before the circuit chip is mounted in the card, which opening leads to an interconnection layer of aluminum or the like through a protection film on a surface. Thus, the aluminum of the interconnection layer may suffer from corrosion during a period from the manufacture of the circuit chip to mounting in the card and due to secular change after assembly. In the circuit chip mounted card according to the present invention, the first and second circuit chips can be connected through the anisotropic conductor after manufacture, as external arrangement of the interconnection is not necessary when they are mounted in the card. In other words, corrosion of the aluminum of the interconnection layer or the like is reduced as the first and second circuit chips are closely connected through the anisotropic conductor.

In a preferred embodiment of the circuit chip mounted card according to the present invention, a reinforcing member including a frame which is arranged to surround the first and second circuit chips in a direction of the face of the chip is provided in the card.

Such structure effectively increases rigidity of the card in vicinity of the circuit chip while ensuring a space for the stacked circuit chips. Thus, even if significant bending, twisting and pressing forces are applied to the card, the stacked circuit chips would not significantly be deformed. In other words, the circuit chip mounted card is provided with increased reliability.

According to one aspect, a circuit chip module of the present invention forming a card with a circuit including an antenna for communication utilizing an electromagnetic wave and a processing portion performing a process for communication includes: a first circuit chip including at least a portion of the processing portion and a terminal; and a second circuit chip including the antenna and the remaining portion of the processing portion and having a terminal, and is characterized in that the first and second circuit chips are stacked in a direction of thickness of the card to electrically connect the terminals.

Such structure of the circuit chip module according to the present invention enables a communication function to be performed only by a small circuit chip module. Thus, elements in the card can more freely be arranged. In addition, as a preliminary formed single module is merely involved for assembly, the manufacturing cost is further reduced with increased workability.

In a preferred embodiment of the circuit chip module according to the present invention, a resonance frequency of a resonance circuit including a capacitor provided inside the circuit chip and a coil for the antenna can be adjusted.

Such structure allows the capacitance or inductance of the resonance circuit to be adjusted after the capacitor and coil are formed in the circuit chip. Thus, the resonance frequency can be adjusted after formation of circuit elements though these circuit elements of the resonance circuit are all formed in the circuit chip.

More specifically, the circuit chip mounted card is provided with high reliability as the resonance frequency can be maintained at a prescribed level to some extent even if there is a variation in manufacturing conditions. Further, since a circuit chip corresponding to various resonance frequencies is obtained without changing a mask pattern for forming the circuit elements in a manufacturing process of the circuit chip, the manufacturing cost is not increased.

According to another aspect, a circuit chip module of the present invention is a composition of circuit chips including stacked first and second circuit chips, and characterized in that at least one of the first and second circuit chips is provided with a detour interconnection which electrically connects two terminals of the above mentioned one circuit chip and the detour interconnection electrically connects two terminals of the other circuit chip respectively connected to the two terminals.

With such structure, the circuit chip module according to the present invention can only perform an essential function when two circuit chips are connected. Thus, even when the circuit chip module is divided into two circuit chips, it is difficult to analyze the function by each terminal. A plurality of detour interconnections would further make it difficult to analyze the function. In other words, the circuit chip module with high security is achieved.

BEST MODES FOR CARRYING OUT THE INVENTION

Figure 1:
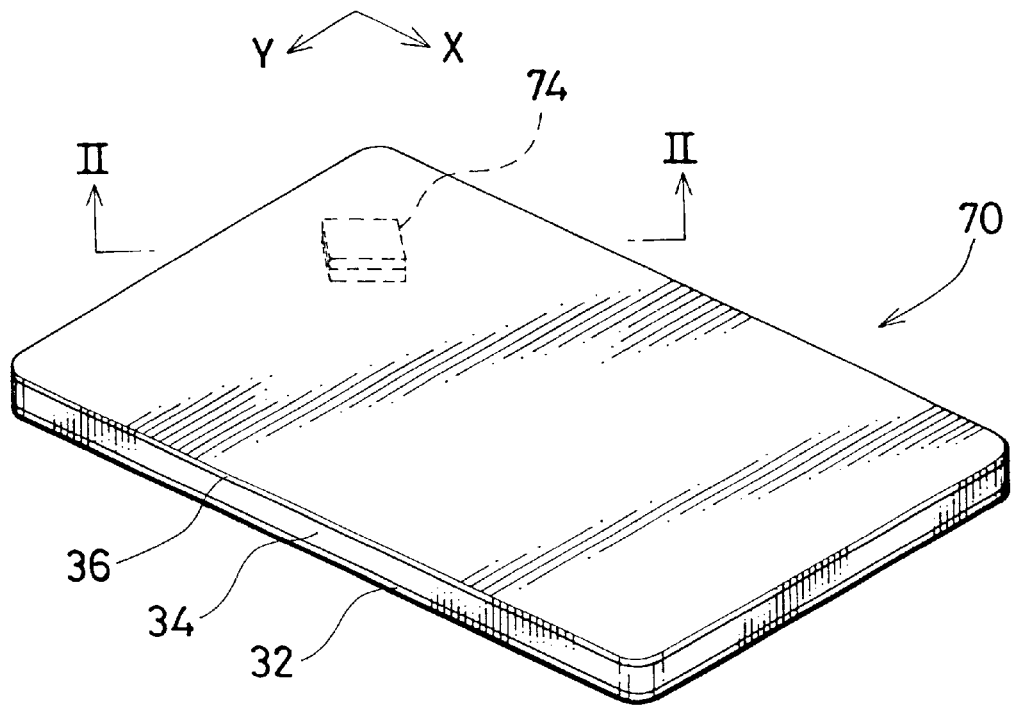
FIG. 1 is a view showing an overall appearance of a non-contact type IC card 70 according to one embodiment of the present invention.

FIG. 1 is a view showing an overall appearance of non-contact type IC card 70 as a circuit mounted card according to one embodiment of the present invention. IC card 70 is a single coil type IC card which can be used for the gate of the ski lift, the gate at the station and automatic sorting of parcels and the like.

Figure 2:
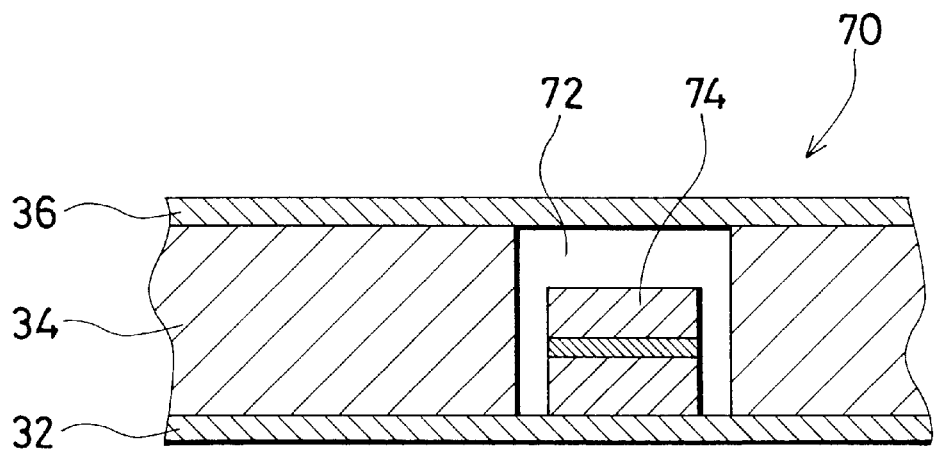
FIG. 2 is cross sectional view taken along the line II—II in FIG. 1

FIG. 2 is a cross sectional view taken along the line II—II in FIG. 1. IC card 70 has a structure having a surface layer material 32 of a first base material, a core member 34 forming a core member layer and a surface layer material 36 of a second base material, which are stacked in this order. Synthetic resin such as vinyl chloride, PET (polyethylene terephthalate) or the like is used for surface layer materials 32 and 36. Core member 34 includes synthetic resin.

A cavity 72 is provided in the layer of core member 34. In cavity 72, an IC chip module 74 is fixed as a circuit chip module in contact with surface layer material 32.

Figure 3A:
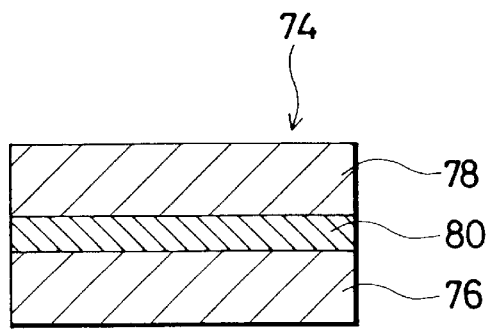
FIG. 3A is a front view showing an IC chip module 74.

FIG. 3A is a front view of IC chip module 74. IC chip module 74 is a composition including an IC chip 76 of a first circuit chip and an IC chip 78 of a second circuit chip which are stacked in a direction of thickness (see FIG. 2) of IC card 70 through an anisotropic conductor 80.

Figure 3B:
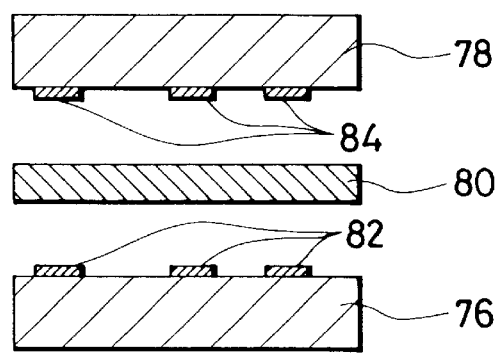
FIG. 3B is a view showing elements of IC chip module 74 before they are connected together.

FIG. 3B shows elements of IC chip module 74 before they are connected together. IC chip 76 is provided on its top with a plurality of bumps 82 for terminals. IC chip 78 is provided on its bottom a plurality of bumps 84 for terminals. Bumps 82 and 84 are arranged in mutually opposite positions.

Anisotropic conductor 80 is a conductor having a conductivity only in one direction and provided with adhesion. As the anisotropic conductor, anisolum (Hitachi Chemical Co., Ltd.), which is a thermosetting adhesive, is used. Such anisotropic conductor 80 enables IC chips 76 and 78 to be firmly adhered. Adhesion of IC chips 76 and 78 using anisotropic conductor 80 allows bumps 82 and 84 provided in mutually opposite positions to be electrically connected. Thus, IC chip module 74 is formed.

Figure 4:
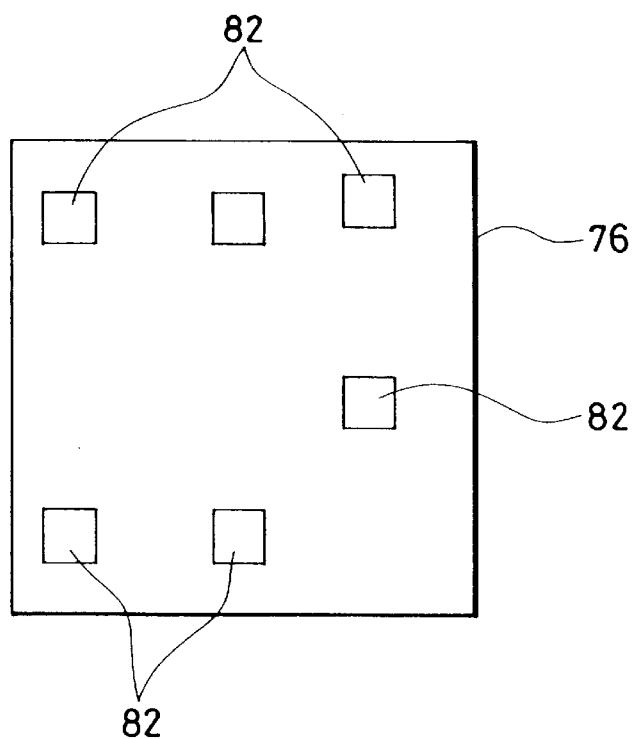
FIG. 4 is a schematic diagram showing an IC chip 76 shown in FIG. 3B when views from above (from the side of a bump 82).

FIG. 4 is a schematic diagram showing IC chip 76 when viewed from above (from the side of bumps 82). IC chip 76 is provided with a nonvolatile memory (not shown) and a modulating/demodulating circuit (not shown) which are part of the processing portion and the like.

Figure 5:
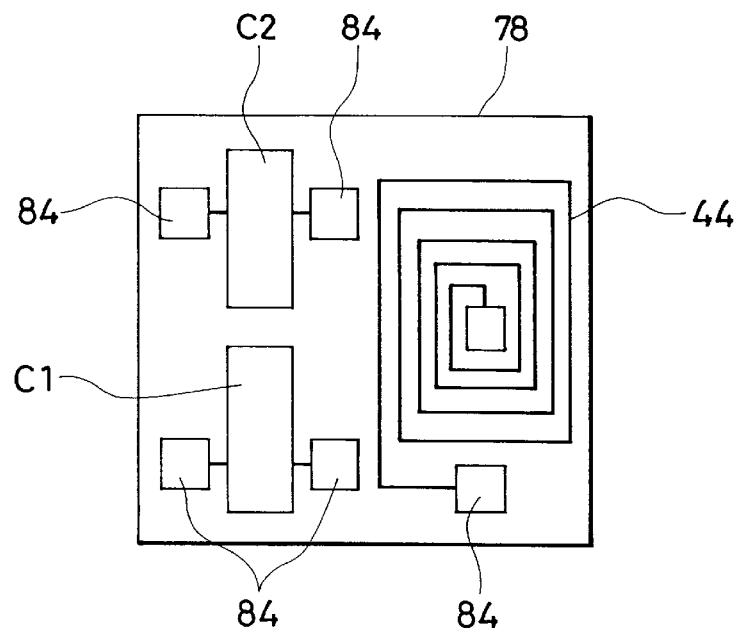
FIG. 5 is a schematic diagram showing an IC chip 78 shown in FIG. 3B when viewed from below (from the side of a bump F4).

FIG. 5 is a schematic diagram showing IC chip 78 when viewed from below (from the side of bumps 84). IC chip 78 is provided with a coil 44 of an antenna, capacitors C1 and C2 which are the remaining portion of the processing portion and the like. A metal interconnection layer is configured in a loop like shape to form coil 44. At least one of capacitors C1 and C2 includes a ferroelectlic substance. In addition, coil 44 and capacitor C1 form a resonance circuit. Capacitor C2 is used for smoothing a power supply.

Such structure enables a communication function to be achieved simply by stacking IC chips 76 and 78 provided with functions of the processing portion and the antenna, so that the interconnection needs not be arranged outside IC chips 76 and 78. In addition, even if deflection is repeatedly caused for IC card 70, breakage of the external interconnection or accidental disconnection would not happen.

Further, a position in which the IC chip is arranged is not restricted to ensure a space for a coil because coil 44 is included in IC chip 78 which is stacked on IC chip 76. Thus, IC chips 76 and 78 with a small area when viewed from above can be arranged in an arbitrary position where a significant deflection would not be caused. As a result, even if a significant force is applied to IC card 70, stacked IC chips 76 and 78 would not significantly be deformed.

Since the connecting operation of the external interconnection is eliminated, assembly operation would be extremely facilitated. Thus, reduction in the manufacturing cost is achieved. Further, as capacitors C1 and C2 are also included in IC chip 78, operation for mounting these capacitors C1 and C2 is not necessary. As a result, further reduction in the manufacturing cost is achieved.

A small IC chip module 74 can perform the communication function. Thus, the elements in IC card 70 are more freely arranged. Preliminary formed single IC chip module 74 needs only be handled during assembly, so that further reduction in the manufacturing cost is achieved with increased workability.

Figure 6:
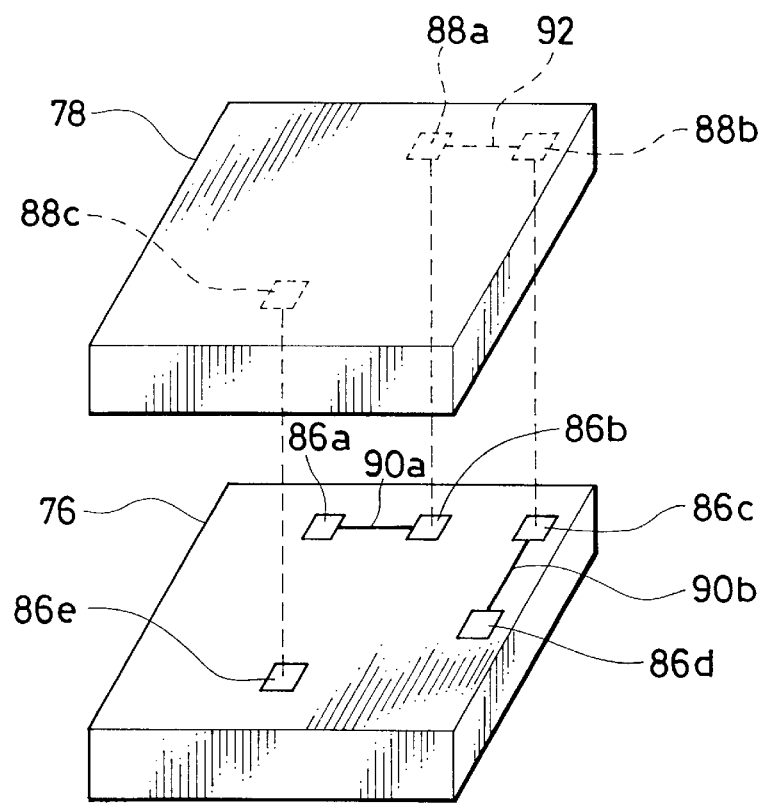
FIG. 6 is a diagram shown in conjunction with a detour interconnection and dummy bump.

Next, the detour interconnection, dummy bump and dummy interconnection used in IC chip module 74 will be described. FIG. 6 is a diagram shown in conjunction with the dummy bump and detour interconnection.

For IC chips 76 and 78, bumps 86a to 86e and 88a to 88c shown in FIG. 6 are provided in addition to bumps 82 and 84 shown in FIG. 4 and 5. Further, interconnections 90a, 90b and 92 are provided. The interconnection shown in FIG. 6 corresponds to the detour interconnection. Bumps 86e and 88c are dummy bumps.

Bumps 86a and 86b provided for IC chip 76 are connected by an interconnection 90a provided for IC chip 76. Bumps 86c and 86d are connected by an interconnection 90b provided inside IC chip 76. On the other hand, bumps 88a and 88b provided for IC chip 78 are connected by an interconnection 92 provided inside IC chip 78.

Bump 86b provided for IC chip 76 and bump 86a provided for IC chip 78 are arranged in opposite positions. Similarly, bump 86c provided for IC chip 76 and bump 86a provided for IC chip 78 are arranged in opposite positions.

Thus, when IC chips 76 and 78 are connected through anisotropic conductor 80 (see FIG. 3B), bump 86a provided for IC chip 76 is connected to bump 86d through interconnection 90a, bump 86b, bump 88a, interconnection 92, bump 88b bump 86c and interconnection 90b.

With such structure, IC card 70 would not perform an essential function unless two IC chips 76 and 78 are connected. Thus, even if IC chip module 74 is to be divided into two IC chips, it is difficult to analyze the function by each terminal.

Although bump 86e provided for IC chip 76 and bump 88c provided for IC chip 78. are arranged in opposite positions, they are dummy bumps which are not electrically connected to any other element. Further, the interconnection (not shown) which is not connected to any element other than bumps may be provided. This is called a dummy interconnection.

Provision of a plurality of such detour interconnection, dummy bumps and dummy interconnections makes it more difficult to analyze the function. In other words, an IC chip module with high security is achieved. In addition, an IC card with high security is achieved by inclusion of such IC chip module 74.

It is noted that thicknesses of surface layer materials 32 and 36 are both 0.1 mm and an overall thickness of IC card 70 is 0.768 mm. Each of IC chips 76 and 78 is square in shape having a side of 3 mm, an internal thickness of the IC chip is 0.2 mm, and thicknesses of bumps 82 and 84 are both 0.11 mm. A thickness of IC chip module 74 after connection is about 0.55 mm. It is noted that the present invention is not limited to these dimensions and materials.

An operation of IC card 70 is similar to that of conventional IC card 2. In other words, an electromagnetic wave transmitted from a reader/writer (writing/reading apparatus, not shown) is received by a resonance circuit (not shown) formed of coil 44 and capacitor C1 included in IC chip 78 as a power source. The received power is smoothed by capacitor C2.

The information transmitted by the electromagnetic wave is decoded by a control portion (not shown) provided in IC chip 76 for response. The response is performed by changing an impedance of the resonance circuit. The reader/writer obtains a content of the response by detecting a change in an impedance of its own resonance circuit (not shown) due to the change in the impedance of the resonance circuit of IC card 77.

Thus, information is transmitted and received in a non-contact state without providing a power supply source in the card.

It is noted that although IC chips 76 and 78 are connected together in a stack with anisotropic conductor 80 interposed in the above embodiment, IC chips 76 and 78 may be directly connected without anisotropic conductor 80 interposed. In this case, for example, one of bumps 82 and 84 may be formed of gold (Au) and the other of tin (Su), so that they are connected by utilizing eutectic. Thus, two IC chips 76 and 78 can readily be connected to form a module using a conventional technique of connecting terminals.

In addition, in the above described embodiment, although at least one of capacitors C1 and C2 is formed of a ferroelectric substance, all of the capacitors may be formed of general dielectric capacitors.

Although an antenna included in IC chip 78 corresponds to coil 44 formed on metal interconnection layer 6, the antenna is not limited to such configuration. Further, although capacitors C1 and C2 are both formed in IC chip 78, the coil and capacitor may be formed in different IC chips.

Figure 7:
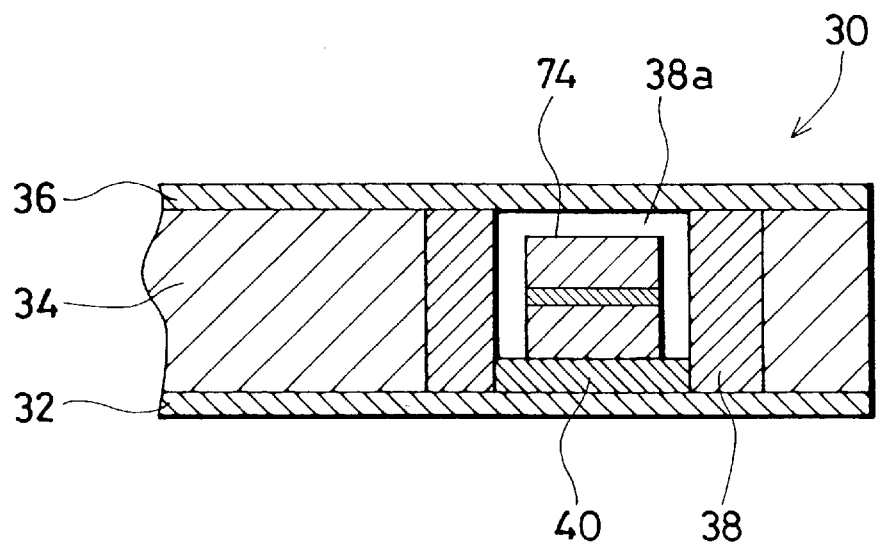
FIG. 7 is a cross sectional view showing a non-contact type IC card 30 according to another embodiment of the present invention.

FIG. 7 is a cross sectional view showing a non-contact type IC card 30 as a circuit chip mounted card according to another embodiment of the present invention. The appearance of IC card 30 is almost the same as that of IC card 70. Further, IC chip module 74 looks almost the same as that in the case of IC card 70. Thus, the operation of IC card 30 is similar to that of IC card 70.

As shown in FIG. 7, IC card 30 includes a surface layer material 32 of a first base material, a core member 34 and a surface layer material 36 of a second base material, which are stacked in this order. Synthetic resin such as vinyl chloride, PET (polyethylene terephthalate) or the like is used. In addition, core member 34 is formed of synthetic resin.

A ceramic frame 38 is provided in the layer of core member 34. Ceramic frame 38 includes ceramic in a cylindrical shape. Ceramic frame 38 corresponds to a frame of a reinforcing member. In other words, the reinforcing member includes only a frame in the present embodiment.

Internal portion 38*a* of ceramic frame 38 is a cavity. An elastic material 40 is provided as a shock absorbing material at a lower end of internal portion 38*a* of ceramic frame 38 in contact with surface layer material 32. Silicon rubber provided with adhesion is used as elastic material 40. IC chip module 74 as a circuit chip module is supported by elastic material 40.

As the reinforcing member includes ceramic, high rigidity is ensured. Thus, provision of ceramic frame 38 in the layer formed of core member 34 greatly increases bending, twisting and pressing rigidity of IC card 30 in vicinity of ceramic frame 38.

As a result, even if a significant bending, twisting and pressing force or the like is applied to IC card 30, IC chip module 74 provided in internal portion 38*a* of ceramic frame 38 would not significantly be deformed. Thus, even if a bending, twisting, pressing force or the like is applied, it is unlikely that IC chip module 74 would be damaged. In other words, IC card 30 is provided with higher reliability.

Further, since IC chip module 74 is fixed with elastic material 40 interposed, even when a shock is applied to IC card 30, it is not directly transferred to IC chip module 74. Thus, damage of IC chip module 74 due to the shock is reduced.

It is noted that thicknesses of surface layer materials 32 and 36 are both 0.1 mm and an overall thickness of IC card 30 is 0.768 mm in the present embodiment. In addition, IC chip module 74 is a square having a side of 3 mm. It is noted that a thickness of IC chip module 74 is set to about 0.4 mm unlike the above described embodiment.

A thickness of elastic material 40 is 0.118 mm. A height of ceramic frame 38 is 0.568 mm. An inner diameter of ceramic frame 38 is set such that a clearance with respect to the mounted IC chip module 74 is about 0.2 mm to 0.3 mm. Further, an outer diameter of ceramic frame 38 is about 23 mm. It is noted that the present invention is not limited to these dimensions and materials.

In the present embodiment, IC chip module 74 is fixed to surface layer material 32 with elastic material 40 as shown in FIG. 7. However, IC chip module 74 may directly be fixed to surface layer material 32 without elastic material 40 interposed.

Figure 8:
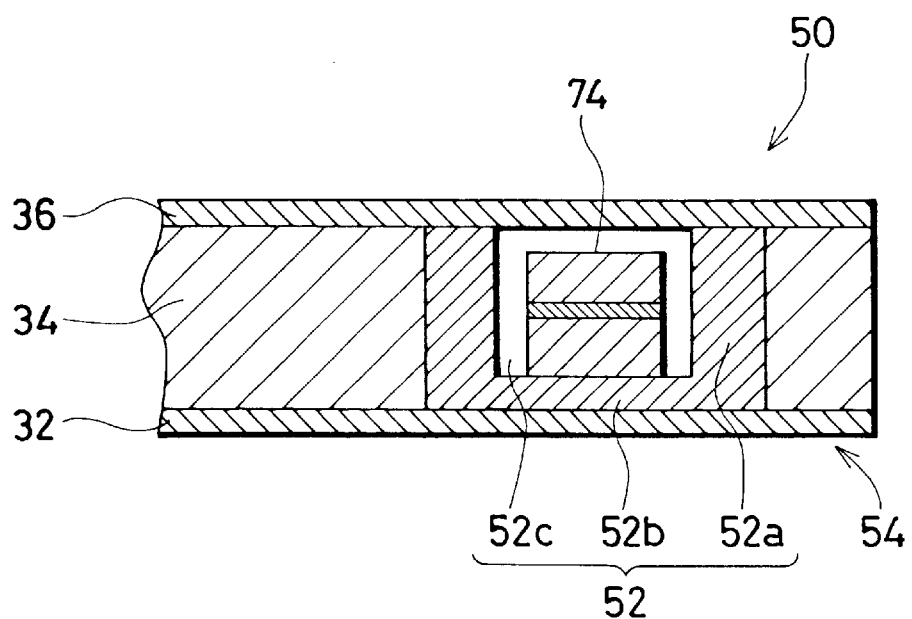
FIG. 8 is a cross sectional view showing a non-contact type IC card 50 according to still another embodiment of the present invention.

FIG. 8 is a cross sectional view showing a non-contact type IC card 50 as a circuit chip mounted card according to still another embodiment of the present invention. An overall structure of IC card 50 is similar to that of IC card 30.

In IC card 50, however, ceramic frame 52 is different from ceramic frame 38 of IC card 30 in shape as shown in FIG. 8. More specifically, ceramic frame 52 is different from ceramic frame 38 formed of only a frame in a cylindrical shape in that it includes a cylindrical portion 52*a* of a frame and a plate like bottom portion 52*b* integrated with the lower end of cylindrical portion 52*a*.

Further, as shown in FIG. 8, IC chip module 74 is structured to be directly fixed to bottom portion 52*b* of a recessed space 52*c* defined by cylindrical portion 52*a* and bottom portion 52*b* of ceramic frame 52.

Thus, as bottom portion 52*b* is integrated with the lower end of cylindrical portion 52*a*, ceramic frame 52 is provided with higher rigidity. Thus, even when ceramic frame 52 is increased in size in face directions (X and Y directions in FIG. 1) to some extent, desired rigidity is ensured. Accordingly, the dimension of IC chip module 74 is increased. Therefore, a dimension of coil 44 included in IC chip module 74 is further increased.

As shown in FIG. 8, frame module 54 is formed with ceramic frame 52 and IC chip module 74 fixed to ceramic frame 52. Such module enables increase in workability during manufacture and reduction in the manufacturing cost.

Although IC chip module 74 is structured to be directly fixed to bottom portion 52b of ceramic frame 52 in the present embodiment, elastic material 40 as shown in FIG. 7 may be interposed between IC chip module 74 and bottom portion 52b of ceramic frame 52. Such structure reduces the shock applied to the card.

Figure 9:
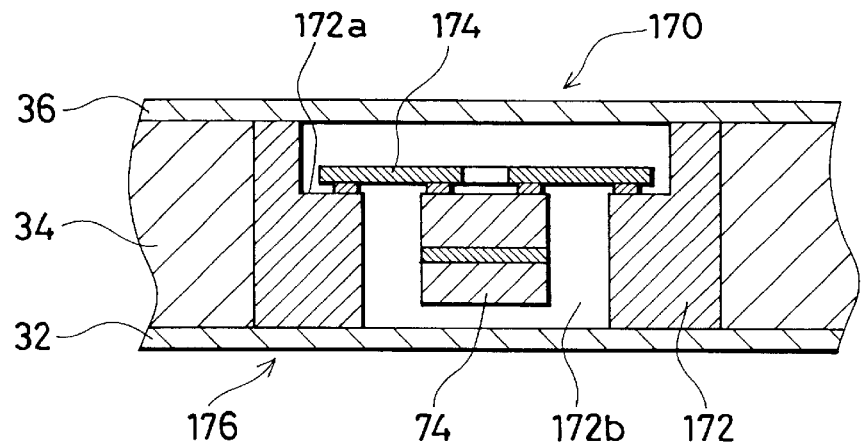
FIG. 9 is a cross sectional view showing a non-contact type IC card 170 according still another embodiment of the present invention.

FIG. 9 is a cross section showing a non-contact type IC card 170 as a circuit chip mounted card according to still another embodiment of the present invention. An overall appearance of IC card 170 is similar to that of IC card 30.

As shown in FIG. 9, ceramic frame 172 of IC card 170 is different from ceramic frame 38 of IC card 30 in shape. More specifically, although ceramic frame 170 is formed in a single cylinder shape similar to outer ceramic frame 38, it is different from ceramic frame 38 in that the inner portion thereof is formed in a stepped cylinder shape.

As shown FIG. 9, a support film 174 of a shock absorbing member is adhered to a stepped portion 172a of ceramic frame 172. Support film 174 is a film of synthetic resin formed in a hollow disk like shape. Thus, support film 174 is supported by stepped portion 172a of ceramic frame 172 in internal space 172b of ceramic frame 172 in a floating state.

IC chip module 74 is adhered to almost the middle portion of support film 174. Thus, IC chip module 74 is supported by support film 174 in internal space 172b of ceramic frame 172 in a floating state.

Such structure further ensures that the shock applied to the card is reduced. In addition, as shown in FIG. 9, ceramic frame 172, support film 174 and IC chip module 74 form a frame module 176. Such module enables increase in workability during manufacture and reduction in the manufacturing cost.

Although the film of synthetic resin in a hollow disk like shape is used as the shock absorbing member, the shape and material of shock absorbing member is not limited to this.

Further, although a cylinder with no base or with base is used for the reinforcing member, inner and outer shapes of the cylinder are not limited to such cylinder. For example, the reinforcing member may assume a hollow square pole. The reinforcing member is not limited to the cylinder, and may assume a shape of a disk. Further, a plurality of reinforcing members may be provided. For example, reinforcing members may be provided on and under the circuit chip to sandwich the same.

Although the reinforcing member includes ceramic in the aforementioned embodiment, a material other than ceramic may be employed as long as it is provided with high rigidity. For example, a metal material such as stainless steel, hard synthetic resin or the like may be used.

Figure 13A:
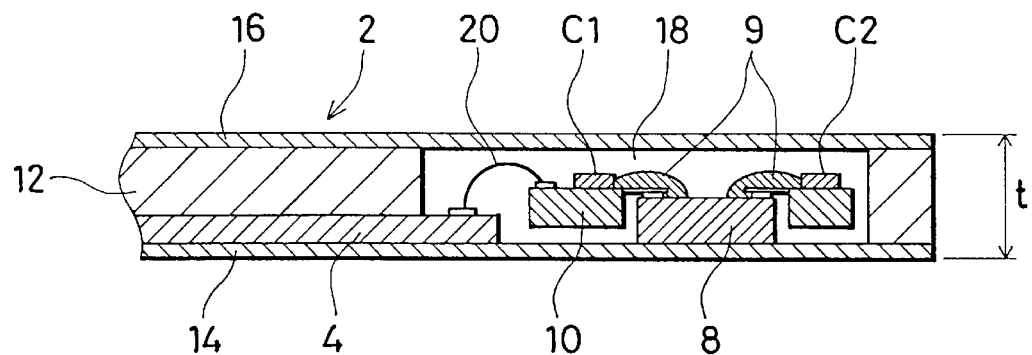
FIG. 13A is a cross sectional view taken along the line XIIIA—XIIIA in FIG. 12.
Figure 13B:
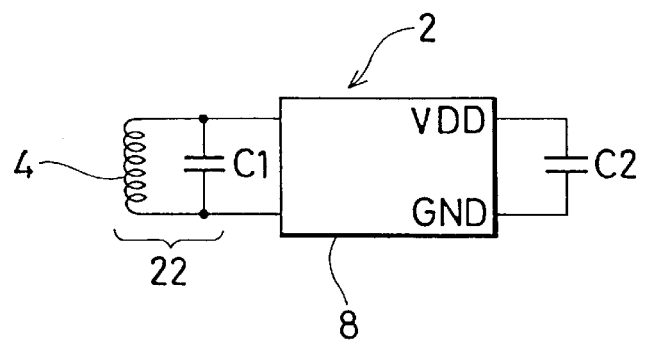
FIG. 13B is a circuit diagram of an IC card 2.

An IC chip module as a circuit chip module according to still another embodiment of the present invention will be described. The IC chip module is similar to IC chip module 74 shown in FIG. 3. It is noted that although the resonance circuit of IC chip module 74 shown in FIG. 3 is similar to resonance circuit 22 shown in FIG. 13B, a resonance circuit of the IC chip forming the IC chip module according to the present embodiment corresponds to a resonance circuit 150 shown in FIG. 10 and is different.

Figure 10:
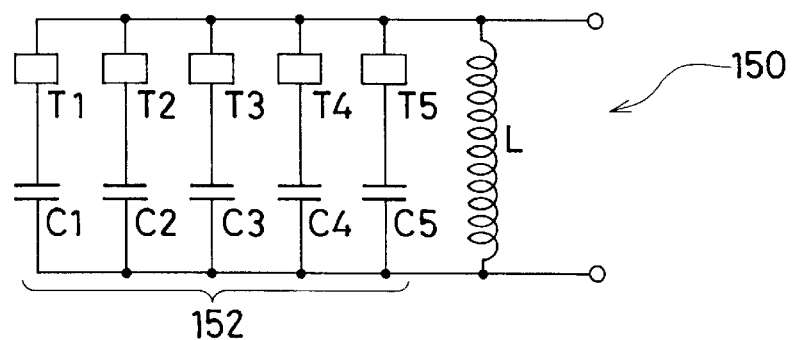
FIG. 10 is a diagram showing a resonance circuit 150 of an IC chip module according to still another embodiment of the present invention.

Resonance circuit 150 is connected as shown in FIG. 10 and includes a capacitor portion 152 having five capacitors C1 to C5 and five laser taps T1 to T5, and a coil L. Capacitors C1 to C5 are respectively connected in parallel through laser taps T1 to T5 in capacitor portion 152. Laser taps T1 to T5 are provided with conductivity and can be disconnected by illumination of laser.

A combined capacitance of capacitor portion 152 can be adjusted by disconnecting a suitable one of laser taps T1 to T5. The adjustment of the combined capacitance of capacitor portion 152 allows a resonance frequency of resonance circuit 150 to be adjusted. It is noted that the disconnection of laser taps T1 to T5 is performed in a step subsequent to formation of capacitors C1 to C5 and coil L in the IC chip and the like.

For example, the resonance frequency is measured while sequentially disconnecting laser taps T1 to T5 and, when the resonance frequency is attained to a prescribed threshold value, the disconnection is stopped.

In addition, when there is little variation in the IC chips which have been manufactured in the same process, an optimum disconnection pattern is found using the IC chip of a test sample, so that laser taps T1 to T5 are subsequently disconnected with the same disconnection pattern for the IC chips manufactured in the same process.

When there are a plurality of kinds of IC chips, a resonance frequency differs in kind of the IC chip can be set by changing the disconnection pattern for laser taps T1 to T5 for every kind of the IC chip.

All of the capacitances of capacitors C1 to C5 may be same or different. For example, capacitances of capacitors C1 to C5 may be 1 $\mu$F, 2 $\mu$F, 4 $\mu$F, 8 $\mu$F and 16 $\mu$F, respectively. This allows the combined capacitance to be adjusted between 1 $\mu$F and 31 $\mu$F by 1 $\mu$F. It is noted that the number of capacitors or laser taps is not limited to five.

Figure 11:
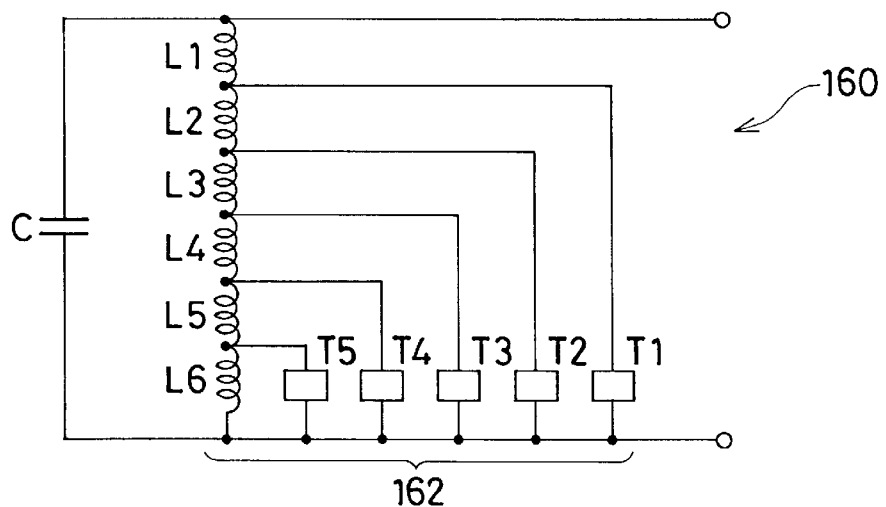
FIG. 11 is a diagram showing a resonance circuit 160 of an IC chip module according to still another embodiment of the present invention.
Figure 12:
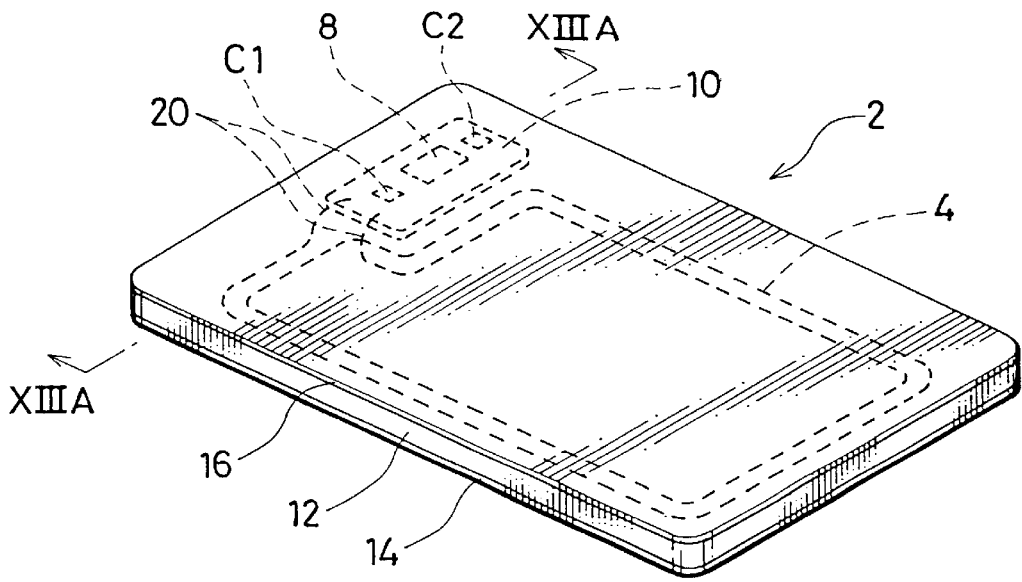
FIG. 12 is a view exemplifying a conventional non-contact type IC card.

A resonance circuit 160 shown in FIG. 11 may be used in place of resonance circuit 150 shown in FIG. 10. Resonance circuit 160 is connected as shown in FIG. 11 and includes a coil portion 162 including six coils L1 to L6 and five laser taps T1 to T5, and a capacitor C. Coils L1 to L6 are connected in series in coil portion 162, the connection point of each coil is structured to be short-circuited through laser taps T1 to T5.

By disconnecting laser taps T1 to T5 in this order, a combined inductance of coil portion 162 can be adjusted. The adjustment of the combined inductance of coil portion 162 allows the resonance frequency of resonance circuit 160 to be adjusted. It is noted the number of coils or laser taps is not limited to five.

The resonance circuit which allows adjustment of the resonance frequency is not limited to these circuits. For example, resonance circuit 150 in FIG. 10 and resonance circuit 160 in FIG. 11 may be combined to form a resonance circuit.

Thus, as the resonance frequency of the resonance circuit can be adjusted, the capacitance or inductance of the resonance circuit can be adjusted after formation of the capacitor and coil in the IC chip. As a result, although circuit elements forming the resonance circuit are all formed in the IC chip, the resonance frequency can be adjusted after these circuit elements are formed.

More specifically, as the resonance frequency is maintained at a prescribed level to some extent even when there is variation in the manufacturing conditions, the IC card including such IC chip is provided with higher reliability. Further, since the IC chip corresponding to various resonance frequencies can be obtained without changing a mask pattern for forming the circuit elements in the manufacturing process of the IC chip, reduction in the manufacturing cost is achieved.

It is noted that although the coil which is formed in a loop like shape is used as an antenna in the above described embodiments, the configuration of the antenna is not limited to this. For example, a metal line in a linear or meander shape may be used.

Although the present invention has been exemplified as being applied to the non-contact type IC card with a single coil in the above embodiments, the present invention may also be applied to a non-contact type IC card with a plurality of coils. Further, the present invention can be applied not only to the IC card but also to a general module or card with a circuit chip. The card herein corresponds to a member in a general disk like shape, and includes a credit card, pass and ticket for railroad, and the like.

What is claimed is:

1. A circuit chip module forming a card with a circuit including an antenna for communication utilizing an electromagnetic wave and a processing portion performing a process for communication, comprising:

a first circuit chip including at least a portion of the processing portion and having a first terminal; and a second circuit chip including the antenna and a remaining portion of the processing portion and having a second terminal, and characterized in that said first circuit chip and said second circuit chip are stacked in a direction of thickness of the card to electrically connect said first terminal with said second terminal, wherein said first circuit chip and said second circuit chip as stacked are free from external electrical connections in regions outside thereof, and further characterized in that a desired resonance frequency is obtained by selectively disconnecting an interconnection for a plurality of capacitors preliminary provided in said first and second circuit chips.

2. A circuit chip module forming a card with a circuit including an antenna for communication utilizing an electromagnetic wave and a processing portion performing a process for communication, comprising:

a first circuit chip including at least a portion of the processing portion and having a first terminal; and a second circuit chip including the antenna and a remaining portion of the processing portion and having a second terminal, and characterized in that said first circuit chip and said second circuit chip are stacked in a direction of thickness of the card to electrically connect said first terminal with said second terminal, wherein said first circuit chip and said second circuit chip as stacked are free from external electrical connections in regions outside thereof, further characterized in that a resonance frequency of a resonance circuit including a capacitor and a coil of the antenna provided in said first and second circuit chips can be adjusted, and that a desired resonance frequency is obtained by selectively disconnecting an interconnection for a plurality of coils preliminary provided in said first and second circuit chips.

3. A composition of circuit chips including a first chip and a second chip in a stack, characterized in that at least two first electrodes are provided for said first chip on a side of said second chip, and at least two second electrodes are provided for said second chip on a side of said first chip, wherein said at least two first electrodes are electrically connected with each other by a detour interconnection, and said first and second chips are stacked to electrically connect said at least two first electrodes with said at least two second electrodes respectively so that said at least two second electrodes are electrically connected with each other through said detour interconnection.

4. A circuit chip mounted card provided with a circuit chip module including a composition of a first circuit chip and a second circuit chip in a stack, wherein said circuit chip module is characterized in that at least two first terminals are provided for said first circuit chip on a side of said second circuit chip, and at least two second terminals are provided for said second circuit chip on a side of said first circuit chip, wherein said at least two first terminals are electrically connected with each other by a detour interconnection, and said first circuit chip and said second circuit chip are stacked to electrically connect said at least two first terminals with said at least two second terminals respectively so that said at least two second terminals are electrically connected with each other through said detour interconnection.

* * * * *